United States Patent
Dzhangirov et al.

(10) Patent No.: US 12,431,458 B2
(45) Date of Patent: Sep. 30, 2025

(54) BONDING DEVICE AND ADJUSTMENT METHOD FOR BONDING HEAD

(71) Applicant: SHINKAWA LTD., Tokyo (JP)

(72) Inventors: Alexander Dzhangirov, Tokyo (JP); Yuichiro Noguchi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 43 days.

(21) Appl. No.: 17/925,314

(22) PCT Filed: May 11, 2021

(86) PCT No.: PCT/JP2021/017854
§ 371 (c)(1),
(2) Date: Nov. 15, 2022

(87) PCT Pub. No.: WO2021/235269
PCT Pub. Date: Nov. 25, 2021

(65) Prior Publication Data
US 2023/0197670 A1    Jun. 22, 2023

(30) Foreign Application Priority Data
May 19, 2020    (JP) ................................ 2020-087251

(51) Int. Cl.
*H01L 23/00*    (2006.01)

(52) U.S. Cl.
CPC .............. *H01L 24/75* (2013.01); *H01L 24/16* (2013.01); *H01L 2224/16221* (2013.01);
(Continued)

(58) Field of Classification Search
None
See application file for complete search history.

(56) References Cited

U.S. PATENT DOCUMENTS 9,136,243 B2 *    9/2015    Schmidt-Lange ..... B23K 31/12
10,692,833 B2    6/2020    Kim et al.
(Continued)

FOREIGN PATENT DOCUMENTS

JP    2002261130 A *    9/2002
JP    2002359263      12/2002
(Continued)

OTHER PUBLICATIONS

"International Search Report (Form PCT/ISA/210) of PCT/JP2021/017854," mailed on Aug. 10, 2021, with English translation thereof, pp. 1-6.
(Continued)

*Primary Examiner* — Devang R Patel
(74) *Attorney, Agent, or Firm* — JCIPRNET

(57) ABSTRACT

A bonding apparatus comprises a chip holding part that disposes a chip part onto a substrate that has been placed on a substrate stage. The bonding apparatus adjusts the inclination of a chip holding surface that releasably holds the chip part. The bonding apparatus comprises: an adjustment controller which stores inclination information pertaining to inclination respectively for locations on a stage main surface having the substrate placed thereon; and a conforming jig which has a conforming surface onto which the chip holding surface is pressed, and in which the inclination of the conforming surface can be changed such that the inclination of the chip holding surface corresponds to the inclination indicated by the inclination information.

7 Claims, 12 Drawing Sheets

(52) U.S. Cl.
CPC ............... *H01L 2224/75303* (2013.01); *H01L 2224/75701* (2013.01); *H01L 2224/75702* (2013.01); *H01L 2224/75745* (2013.01); *H01L 2224/75804* (2013.01); *H01L 2224/75841* (2013.01); *H01L 2224/7592* (2013.01); *H01L 2224/75983* (2013.01); *H01L 2224/75985* (2013.01); *H01L 2924/37001* (2013.01); *H01L 2924/40* (2013.01)

(56) References Cited

U.S. PATENT DOCUMENTS

| | | | | |
|---|---|---|---|---|
| 2005/0071991 | A1* | 4/2005 | Yonezawa | H05K 13/082 29/721 |
| 2010/0122456 | A1 | 5/2010 | Yu et al. | |
| 2018/0102340 | A1* | 4/2018 | Kim | H01L 24/75 |

FOREIGN PATENT DOCUMENTS

| | | | |
|---|---|---|---|
| JP | 2005243665 | A * | 9/2005 |
| JP | 2006253384 | | 9/2006 |
| JP | 2010027728 | | 2/2010 |
| JP | 2010027897 | A * | 2/2010 |
| JP | 2010245370 | | 10/2010 |
| JP | 2012094912 | | 5/2012 |
| JP | 2012174861 | | 9/2012 |
| JP | 2014168089 | | 9/2014 |
| KR | 20180040349 | | 4/2018 |
| TW | 201021138 | | 6/2010 |
| WO | 2015107715 | | 7/2015 |

OTHER PUBLICATIONS

"Office Action of Korea Counterpart Application", issued on Feb. 26, 2024, with English translation thereof, p. 1-p. 11.

"Office Action of Taiwan Counterpart Application" with partial English translation thereof, issued on Nov. 30, 2022, p. 1-p. 9.

"Office Action of Korea Counterpart Application", issued on Sep. 10, 2024, with English translation thereof, p. 1-p. 17.

"Office Action of China Counterpart Application No. 202180035341.0", issued on Aug. 7, 2025, p. 1-p. 22.

"Office Action of Singapore Counterpart Application No. 11202260093V", issued on Aug. 7, 2025, p. 1-p. 9.

* cited by examiner (a)  (b)

BONDING DEVICE AND ADJUSTMENT METHOD FOR BONDING HEAD

CROSS-REFERENCE TO RELATED APPLICATION

This application is a 371 application of the International PCT application serial no. PCT/JP2021/017854, filed on May 11, 2021, which claims the priority benefits of Japan Patent Application No. 2020-087251, filed on May 19, 2020. The entirety of each of the above-mentioned patent applications is hereby incorporated by reference herein and made a part of this specification.

TECHNICAL FIELD

The present invention relates to a bonding apparatus and a bonding head adjustment method.

RELATED ART

Patent Literature 1 discloses a flip-chip mounting method. The mounting method of Patent Literature 1 is used when mounting a semiconductor chip on a circuit board. A suction tool is used to handle the semiconductor chip. First, a suction tool is used to pick up the semiconductor chip placed on a support. Next, the suction tool moves to the bonding stage on which the circuit board is placed while holding the semiconductor chip. Then, the suction tool moves so that the semiconductor chip is disposed at a desired position on the circuit board.

CITATION LIST

Patent Literature

[Patent Literature 1] Japanese Patent Application Laid-Open No. 2012-174861

SUMMARY

Technical Problem

When disposing the semiconductor chip on the circuit board, the suction tool is moved so that the semiconductor chip is disposed with desired positional accuracy with respect to the target position. When disposing the semiconductor chip, the posture of the semiconductor chip with respect to the circuit board is also important. The posture of the semiconductor chip with respect to the circuit board refers to the inclination of the semiconductor chip with respect to the surface of the circuit board on which the semiconductor chip is to be mounted.

For example, it may be required that the bonding surface of the semiconductor chip facing the circuit board be disposed parallel to the mounting surface of the circuit board. If the semiconductor chip is inclined with respect to the mounting surface, mounting defects will occur in the semiconductor chip. For example, there is a possibility that an electrical connection failure may occur between the bump electrodes of the semiconductor chip and the electrode pads of the circuit board. If the inclination of the semiconductor chip with respect to the mounting surface is large, a part of the semiconductor chip may come into contact with the circuit board. If a part of the semiconductor chip contacts the circuit board, the semiconductor chip may be physically damaged. If a mounting defect occurs, the yield in the die bonding operation will decrease.

The present invention provides a bonding apparatus and a bonding head adjustment method capable of improving the yield of die bonding operation.

Solution to Problem

A bonding apparatus according to an embodiment of the present invention includes: a stage including a placement surface on which a substrate is to be placed; a bonding head for disposing a chip part on the substrate placed on the stage and comprising a chip holding surface for holding the chip part by suction and an adjustment part for adjusting an inclination of the chip holding surface; an information holding part for holding inclination information of the stage that associates a position on the placement surface with an inclination at the position; and a conforming jig including a conforming surface onto which the chip holding surface is pressed, in which an inclination of the conforming surface is changeable such that the inclination of the chip holding surface corresponds to an inclination indicated by the inclination information.

According to the bonding apparatus, even when the substrate is placed on the stage, the information holding part has the inclination information of the stage. As a result, the inclination of the bonding head may be adjusted according to the inclination of the place where the chip part is to be disposed. Therefore, the yield of die bonding operation may be improved.

In an embodiment, the conforming jig may include a passive inclination part which includes the conforming surface and in which the conforming surface is passively inclined by a force received by the conforming surface. The bonding apparatus according to an embodiment may further include a control part that acquires the inclination information from the information holding part and controls a force that the chip holding surface applies to the conforming surface based on the inclination at the position when the chip holding surface is pressed against the conforming surface. According to this configuration, the configuration of the conforming jig may be simplified.

In an embodiment, the passive inclination part may include: a plate member including the conforming surface; and an elastic deformation part provided on a surface of the plate member opposite to the conforming surface. The elastic deformation part may be made of a resin material. According to this configuration as well, the configuration of the conforming jig may be simplified.

In an embodiment, the passive inclination part may include: a plate member including the conforming surface; and an elastic deformation part provided on a surface of the plate member opposite to the conforming surface. The elastic deformation part may be a metal spring. According to this configuration as well, the configuration of the conforming jig may be simplified.

In an embodiment, the conforming jig may include an active inclination part which includes the conforming surface and in which the conforming surface is actively inclined regardless of a force received by the conforming surface. The active inclination part may include: a plate member including the conforming surface; and a plate member drive part provided on a surface of the plate member opposite to the conforming surface and actively controlling an inclination of the plate member. The plate member drive part may incline the plate member such that the inclination of the conforming surface corresponds to an inclination indicated by the inclination information provided from the information holding part. According to this configuration, the conforming surface may be reliably inclined as indicated by the inclination information.

Another embodiment of the present invention provides a bonding head adjustment method for adjusting an inclination of a chip holding surface of a bonding head for disposing a chip part with respect to a substrate placed on a placement surface of a stage having the placement surface on which the substrate is to be placed, and the chip holding surface holds the chip part by suction. The bonding head adjustment method includes: a first step of acquiring inclination information that associates a position on the placement surface with an inclination at the position; and a second step of adjusting the inclination of the chip holding surface based on the inclination information associated with the position on the placement surface corresponding to a position of the substrate on which the chip part is to be disposed. According to the bonding head adjustment method, even when the substrate is placed on the stage, the information holding part has the inclination information of the stage main stage. As a result, the inclination of the bonding head may be adjusted according to the inclination of the place where the chip part is to be disposed. Therefore, the yield of die bonding operation may be improved.

In another embodiment, the second step may adjust the inclination of the chip holding surface using a conforming jig in which a conforming surface is passively inclined in response to pressing of the chip holding surface. According to this method as well, the inclination of the bonding head may be adjusted according to the inclination of the place where the chip part is to be disposed.

In another embodiment, the second step may adjust the inclination of the chip holding surface using a conforming jig in which a conforming surface is actively inclined regardless of pressing of the chip holding surface. According to this method as well, the inclination of the bonding head may be adjusted according to the inclination of the place where the chip part is to be disposed.

Effects of Invention

According to the present invention, a bonding apparatus and a bonding head adjustment method capable of improving the yield of die bonding operation are provided.

DESCRIPTION OF THE EMBODIMENTS

Figure 1:
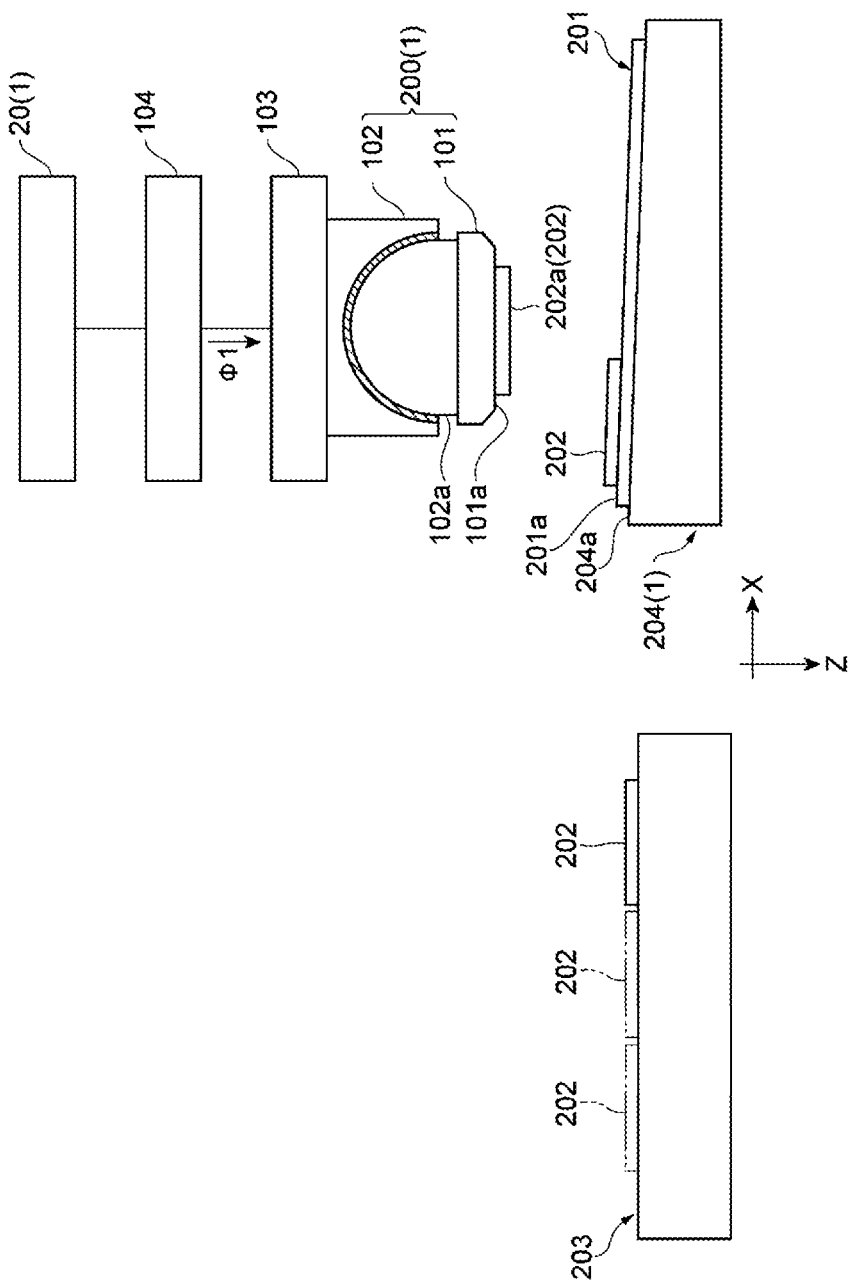
FIG. 1 is a schematic diagram showing a state of a bonding operation to which a bonding apparatus and a bonding head adjustment method are applied.

Hereinafter, embodiments for carrying out the present invention will be described in detail with reference to the accompanying drawings. In the description of the drawings, the same elements are denoted by the same reference numerals, and repeated descriptions are omitted.

As shown in FIG. 1, a bonding apparatus 1 bonds a chip part 202 to a substrate 201. This bonding includes mechanical bonding and electrical bonding. The chip part 202 is, for example, a semiconductor chip obtained by singulating a semiconductor wafer. The chip part 202 may be other packaged electronic parts and the like. Multiple chip parts 202 are placed on a chip stage 203. The substrate 201 is, for example, a circuit board on which wiring patterns and electrode pads are formed. The substrate 201 is placed on a substrate stage 204. A bump electrode provided on the chip part 202 is bonded to an electrode pad on the substrate 201. A bonding head 200 of the bonding apparatus 1 moves above the chip stage 203. Subsequently, the bonding head 200 descends so as to approach the chip stage 203. The bonding head 200 then holds the chip part 202. Subsequently, the bonding head 200 holding the chip part 202 moves above the substrate 201. Subsequently, the bonding head 200 places the chip part 202 at a predetermined position on the substrate 201. The bonding head 200 then performs processing necessary to bond the chip part 202 to the substrate 201. For example, the bonding head 200 applies heat to the chip part 202 to thermally cure an adhesive required for mechanical bonding.

When the chip part 202 is disposed on the substrate 201, the posture of the chip part 202 with respect to the substrate 201 is important. The posture of the chip part 202 with respect to the substrate 201 is, for example, the inclination of a chip bonding surface 202*a* of the chip part 202 with respect to a mounting surface 201*a* of the substrate 201 on which the chip part 202 is to be mounted. Ideally, the chip bonding surface 202*a* should be parallel to the mounting surface 201a. For example, in order to bond the chip part 202, the bonding head 200 of the bonding apparatus 1 may press the chip part 202 toward the substrate 201. If the chip bonding surface 202a is parallel to the mounting surface 201a, the pressing force distribution will not be uneven. If the chip bonding surface 202a is parallel to the mounting surface 201a, the adhesive placed between the chip part 202 and the substrate 201 may be evenly heated. If the chip bonding surface 202a is inclined with respect to the mounting surface 201a, there is a possibility that the pressing force distribution and the heat distribution will be uneven. If the chip bonding surface 202a is extremely inclined with respect to the mounting surface 201a, a part of the chip part 202 may contact the substrate 201.

Therefore, it is important to control of the posture of the chip part 202 with respect to the substrate 201. The bonding apparatus and bonding head adjustment method of this embodiment set the posture of the chip part 202 with respect to the substrate 201 in good condition.

The bonding apparatus 1 will be briefly described. The bonding apparatus 1 includes the bonding head 200, the substrate stage 204 (stage), an adjustment controller 20 (information holding part), and a conforming jig 10 as main components.

The bonding head 200 includes a chip holding part 101 and an inclination adjustment mechanism 102 (adjustment part). The chip holding part 101 includes a chip holding surface 101a. The chip holding part 101 releasably holds the chip part 202 on the chip holding surface 101a. For example, a vacuum suction mechanism or the like may be used to hold the chip part 202. The chip holding part 101 is attached to the inclination adjustment mechanism 102. The inclination adjustment mechanism 102 changes the inclination of the chip holding part 101 with respect to a reference axis. The inclination adjustment mechanism 102 maintains the inclination of the chip holding part 101. The inclination adjustment mechanism 102 includes a spherical air bearing. The inclination adjustment mechanism 102 may freely incline a movable part 102a that configures the bearing. Therefore, the inclination adjustment mechanism 102 may set the chip holding part 101 to any inclination. The position of the movable part 102a is held by vacuum suction, for example. The inclination adjustment mechanism 102 is attached to an actuator 103. The actuator 103 moves the inclination adjustment mechanism 102 and the chip holding part 101 in three axial directions. In the following description, the Z direction is defined as the direction toward or away from the substrate 201 or the like. The direction orthogonal to the Z direction is defined as the X direction. The actuator 103 operates based on a control signal φ1 provided by a main controller 104 (control part).

Figure 2:
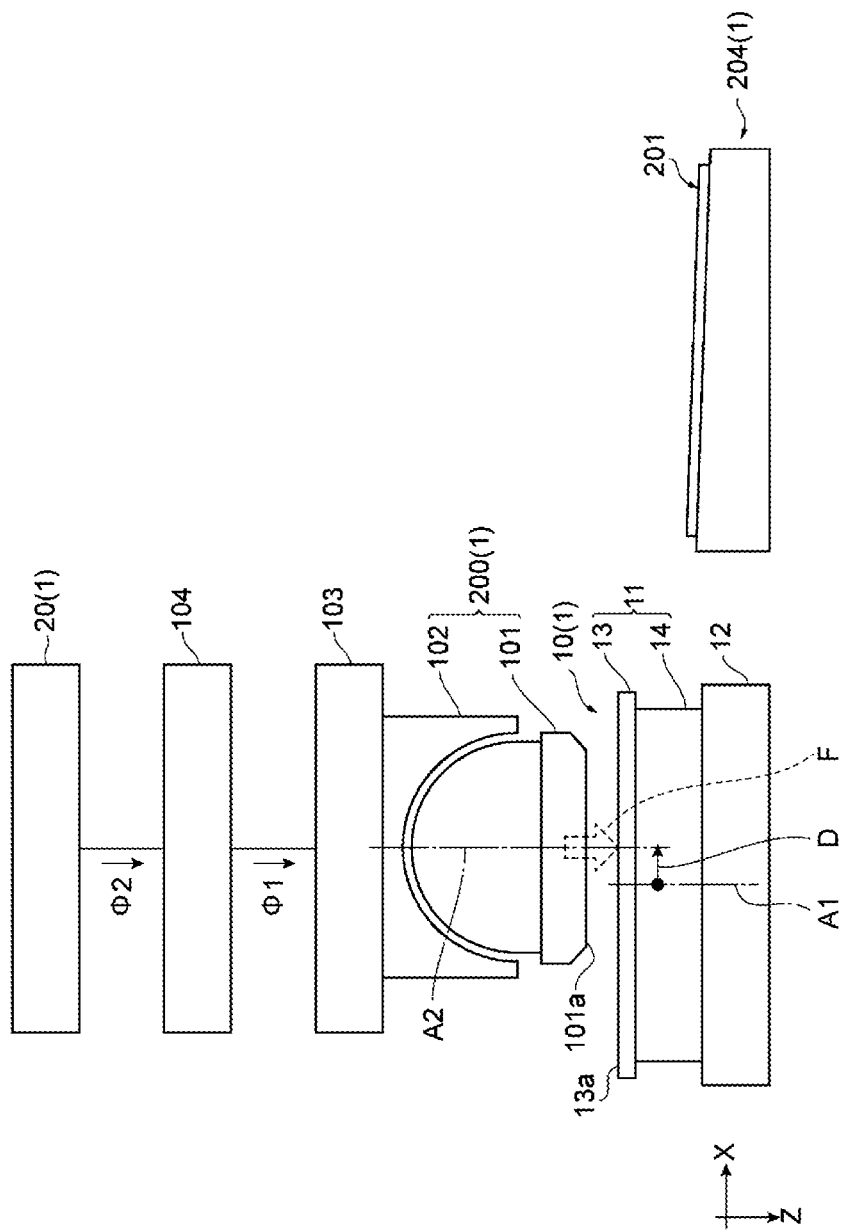
FIG. 2 is a diagram showing a configuration of a bonding apparatus.

As shown in FIG. 2, when the chip holding part 101 is pressed against the conforming jig 10, the conforming jig 10 deforms according to the pressing force. This deformation causes the conforming jig 10 to be inclined. The inclination may be controlled by the deviation D and the magnitude of the pressing force F. The deviation D is the distance from a jig reference axis A1 of the conforming jig 10 to a stage reference axis A2 of the inclination adjustment mechanism 102. The conforming jig 10 may have any inclination. Therefore, by causing the chip holding part 101 to conform to this inclination, the chip holding part 101 may be adjusted to any inclination. This conformation and inclination holding are realized by the inclination adjustment mechanism 102.

The conforming jig 10 includes a passive inclination part 11 and a base 12. The passive inclination part 11 includes a plate member 13 and an elastic deformation part 14. The plate member 13 is a flat plate. The plate member 13 has a rigidity such that it is not significantly deformed by the pressure of the chip holding part 101. The plate member 13 has a conforming surface 13a. The chip holding surface 101a is pressed against the conforming surface 13a. The conforming surface 13a may be larger than the chip holding surface 101a. The elastic deformation part 14 is sandwiched between the plate member 13 and the base 12. The elastic deformation part 14 undergoes significant deformation with respect to the pressing force F. The rigidity of the elastic deformation part 14 is lower than the rigidity of the plate member 13. The rigidity referred to here is the degree of ease of deformation. The rigidity referred to here may also be referred to as elastic modulus or Young's modulus. The elastic deformation part 14 is a block made of rubber or resin. For example, fluorine rubber or silicone rubber may be used for the elastic deformation part 14. However, the elastic deformation part 14 is not limited thereto, and any elastic body may be used. The elastic deformation part 14 may be one or more metal springs. The thickness of the elastic deformation part 14 is greater than the thickness of the plate member 13 from the viewpoint of undergoing a significant inclination. It may also be said that the jig reference axis A1 is the neutral axis of the elastic deformation part 14. When the axis of the pressing force F overlaps the jig reference axis A1, the elastic deformation part 14 contracts in the Z direction without being inclined. It may also be said that the axis of the pressing force F is the stage reference axis A2. When the axis of the pressing force F deviates from the jig reference axis A1, the elastic deformation part 14 contracts in the Z direction. However, the amount of contraction varies from place to place. Therefore, the plate member 13 disposed on the elastic deformation part 14 is inclined.

Figure 3:
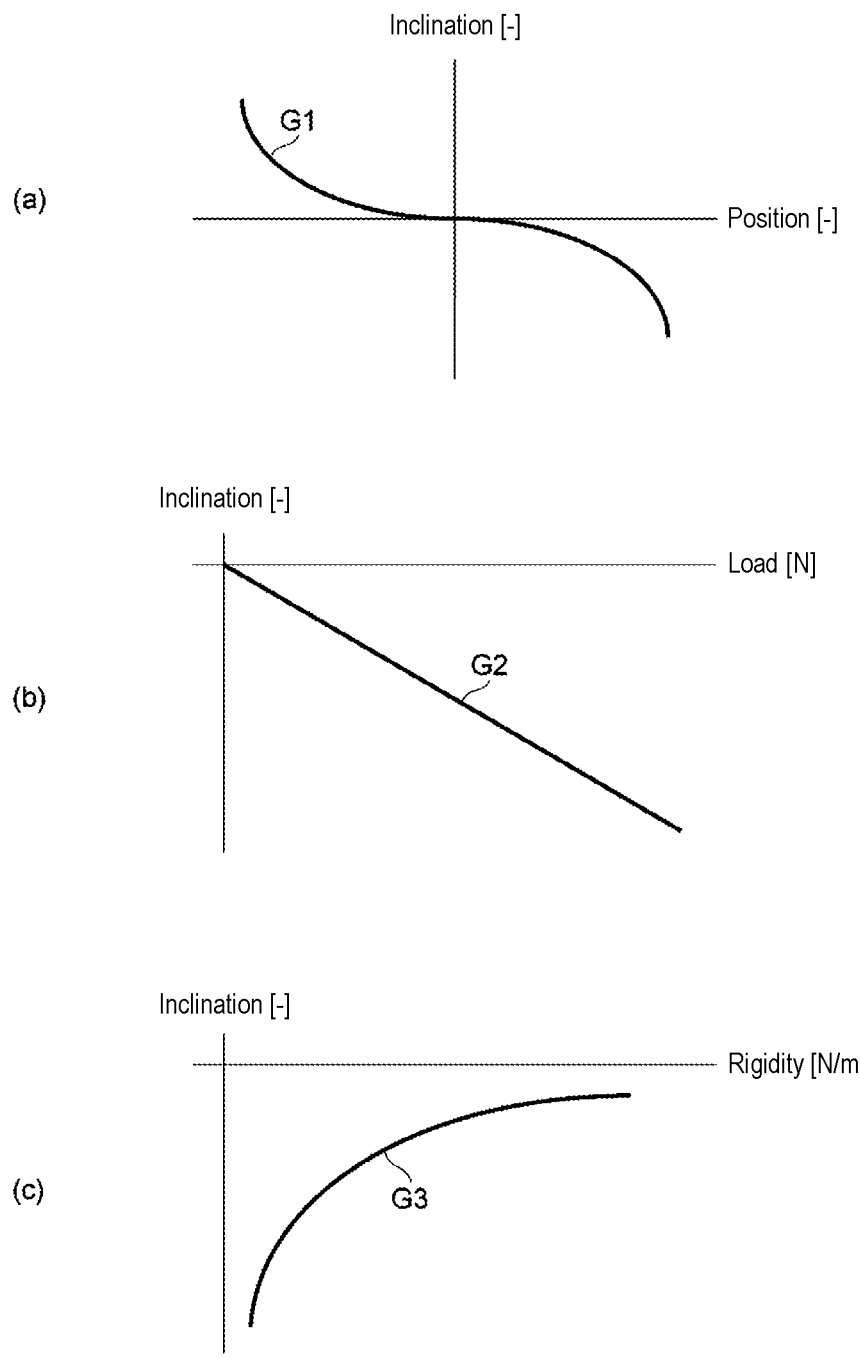
In FIG. 3, (a) of FIG. 3 is a diagram showing the relationship between the position and the inclination of an elastic deformation part; (b) of FIG. 3 is a diagram showing the relationship between the load and the inclination of the elastic deformation part; (c) of FIG. 3 is a diagram showing the relationship between the rigidity and the inclination of an elastic deformation part.
Figure 4:
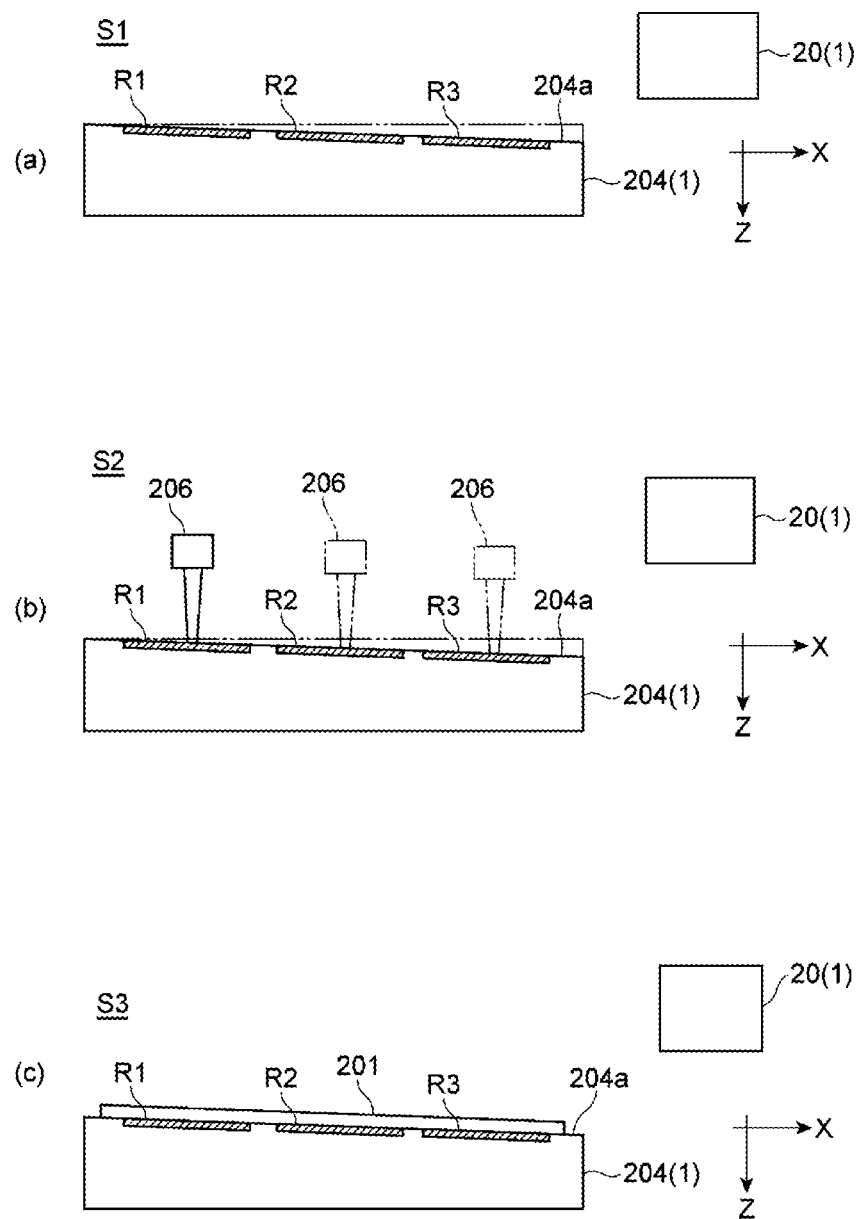
In FIG. 4, (a) of FIG. 4 is a diagram showing a step of a bonding operation; (b) of FIG. 4 is a diagram showing a step following (a) of FIG. 4 in the bonding operation; (c) of FIG. 4 is a diagram showing a step following (b) of FIG. 4 in the bonding operation.

The characteristics of the elastic deformation part 14 may be exemplified by a graph G1 of (a) of FIG. 3 and a graph G2 of (b) of FIG. 3. The horizontal axis in (a) of FIG. 3 indicates the position. The vertical axis in (a) of FIG. 3 indicates the inclination. The position on the horizontal axis is, in other words, the position (deviation D) of the stage reference axis A2 with respect to the jig reference axis A1. A zero position means that the jig reference axis A1 overlaps the stage reference axis A2. The horizontal axis in (b) of FIG. 3 indicates the load. The vertical axis in (b) of FIG. 3 indicates the inclination. The greater the load, the greater the inclination. The graph G2 illustrates a case where the relationship between the load and the inclination is proportional.

Though described later as a first modified example, the elastic deformation part 14 is not limited to a configuration in which the rigidity thereof is constant. The rigidity of the elastic deformation part 14 may be variable as shown in the graph G3 of (c) of FIG. 3. In this case, it is also possible to cause any inclination by controlling the rigidity of the elastic deformation part 14 while keeping the pressing force constant.

The adjustment controller 20 provides a control signal φ2 to the main controller 104 so as to set the pressing mode to cause the desired inclination. The adjustment controller 20 holds information in which a position where the chip part 202 is to be disposed on a stage main surface 204a (placement surface, to be described later) and the inclination of the stage main surface 204a at that position are associated with each other. The adjustment controller 20 receives the position information of the chip part 202 to be placed later from the main controller 104. The adjustment controller 20 retrieves the inclination information corresponding to the received position information. Subsequently, the adjustment controller 20 sets the target inclination of the chip holding part 101 based on the inclination information that has been retrieved. The adjustment controller 20 calculates the deviation D of the stage reference axis A2 from the jig reference axis A1 based on the characteristics of the elastic deformation part 14 shown in (a) and (b) of FIG. 3. The deviation D is converted into the position of the chip holding part 101 in the X direction and the Y direction. The adjustment controller 20 calculates the force with which the chip holding part 101 presses the conforming jig 10. The force with which the chip holding part 101 presses the conforming jig 10 is converted into the position of the chip holding part 101 in the Z direction. The adjustment controller 20 outputs the control signal φ1 to the main controller 104 so as to move the chip holding part 101 to the calculated positions in the X, Y and Z directions.

<Bonding Head Adjustment Method>

A bonding method including a bonding head adjustment method will be described below with reference to FIGS. 4 to 8 as appropriate.

The substrate stage 204 is prepared (S1: (a) of FIG. 4). The substrate 201 is placed on the main surface 204a of the substrate stage 204 in a later step. The positional relationship between the placed substrate 201 and the stage main surface 204a is known in advance. Specifically, the correspondence relationship between the position on the substrate 201 where the chip part 202 is to be disposed and the position of the stage main surface 204a corresponding to the position where the chip part 202 is to be disposed is clear. In the example shown in (a) of FIG. 4, three corresponding regions R1, R2, and R3 are illustrated. Ideally, the stage main surface 204a is perpendicular to the Z direction, as indicated by the two-dot chain line. However, in reality, the stage main surface 204a may be inclined as indicated by the solid line.

Next, the inclination of the stage main surface 204a is acquired (S2 (first step): (b) of FIG. 4). A preferable measurement device 206 capable of measuring the inclination of the surface may be used to acquire the inclination. The measurement device 206 measures the inclination for each measurement position (each of the corresponding regions R1, R2, and R3) on the stage main surface 204a. The measurement device 206 associates the position information with the inclination information and outputs them to the adjustment controller 20.

Next, the substrate 201 is placed on the stage main surface 204a (S3: (c) of FIG. 4). In the steps after step S3, the inclination of the stage main surface 204a cannot be directly measured. However, in the bonding apparatus 1 of the embodiment, the adjustment controller 20 already holds the inclination information corresponding to the region where the chip part 202 is to be disposed. Therefore, even when the substrate 201 is placed on the stage main surface 204a, it is possible to know the inclination corresponding to the region where the chip part 202 is to be disposed.

Figure 5:
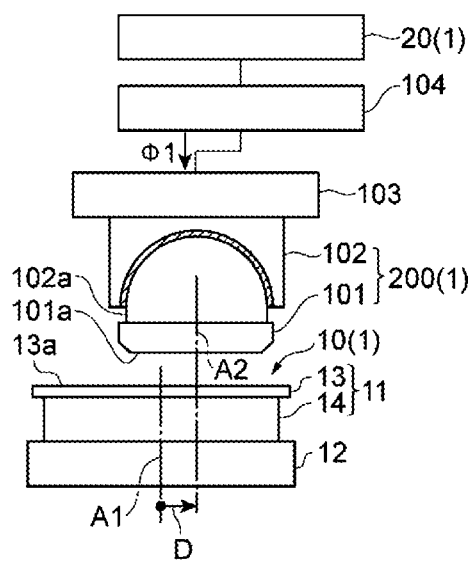
In FIG. 5, (a) of FIG. 5 is a diagram showing a step in a bonding head adjustment operation; (b) of FIG. 5 is a diagram showing a step following (a) of FIG. 5 in the bonding head adjustment operation.
Figure 5:
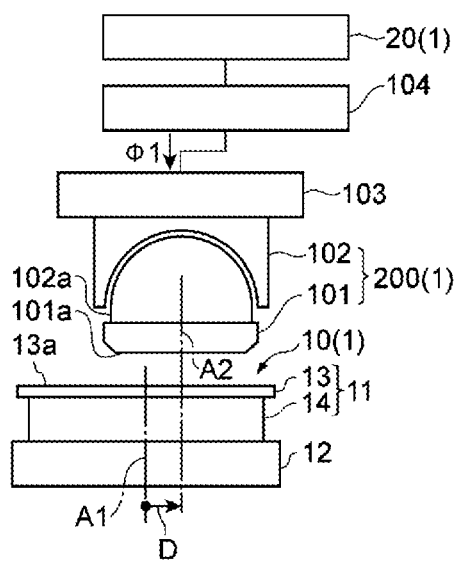
Figure 5:
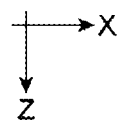
Figure 5:
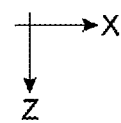
Figure 6:
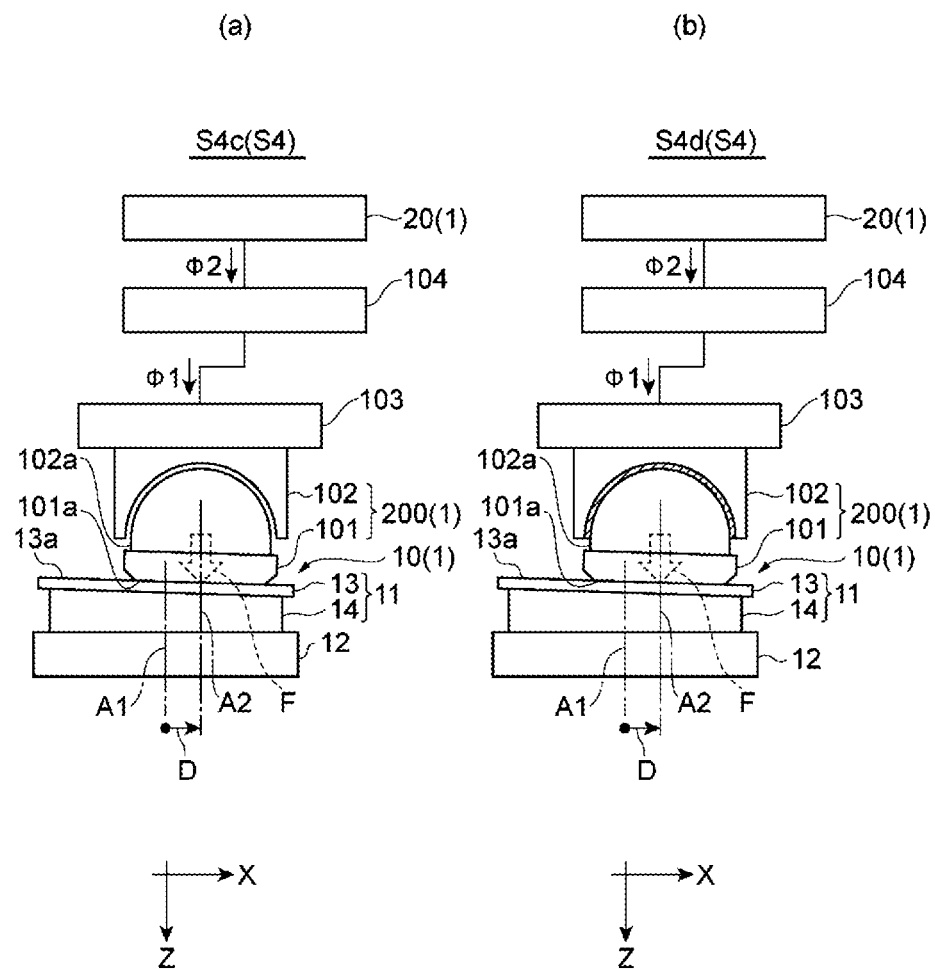
In FIG. 6, (a) of FIG. 6 is a diagram showing a step following (b) of FIG. 5 in the bonding head adjustment operation; (b) of FIG. 6 is a diagram showing a step following (a) of FIG. 6 in the bonding head adjustment operation.
Figure 7:
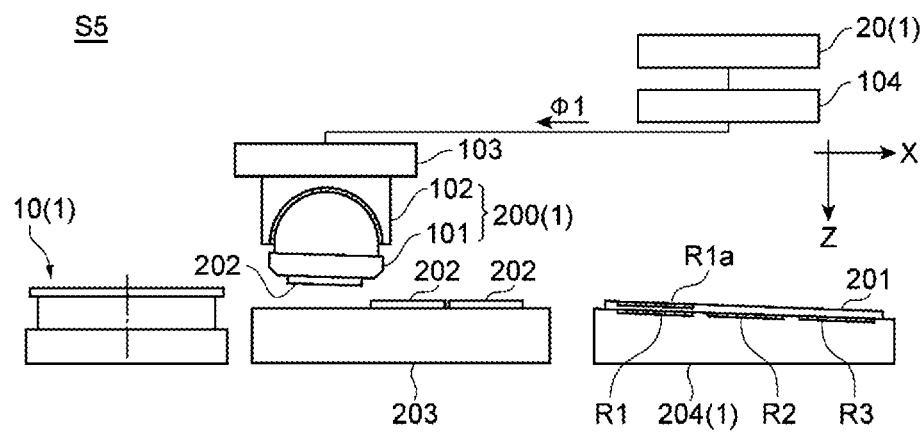
In FIG. 7, (a) of FIG. 7 is a diagram showing a step of the bonding operation following the bonding head adjustment operation; (b) of FIG. 7 is a diagram showing a step following (a) of FIG. 7 in the bonding operation.
Figure 7:
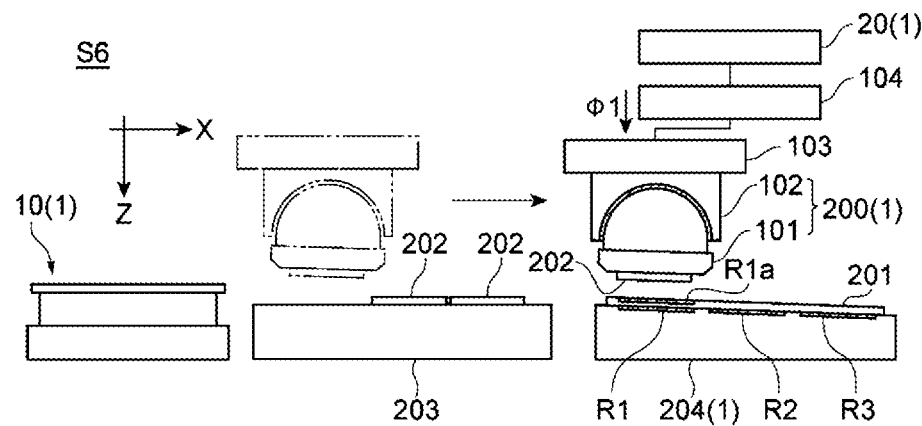
Figure 8:
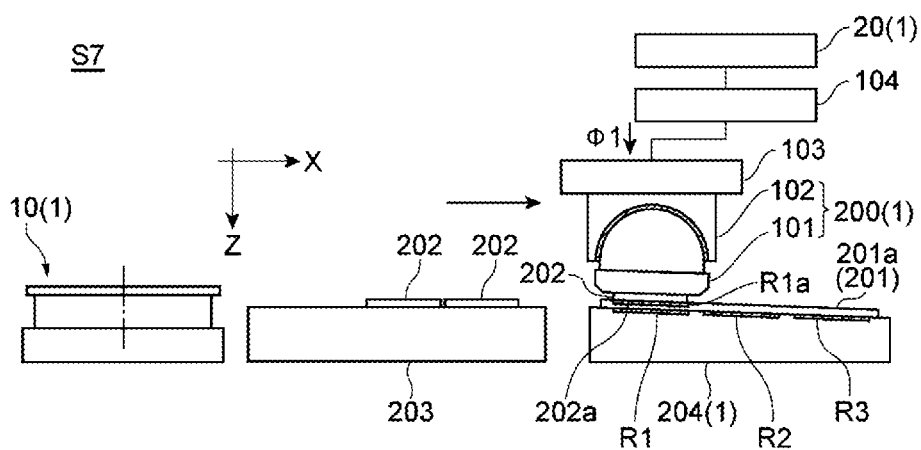
In FIG. 8, (a) of FIG. 8 is a diagram showing a step following (b) of FIG. 7 in the bonding operation; (b) of FIG. 8 is a diagram showing a step following (a) of FIG. 8 in the bonding operation.
Figure 8:
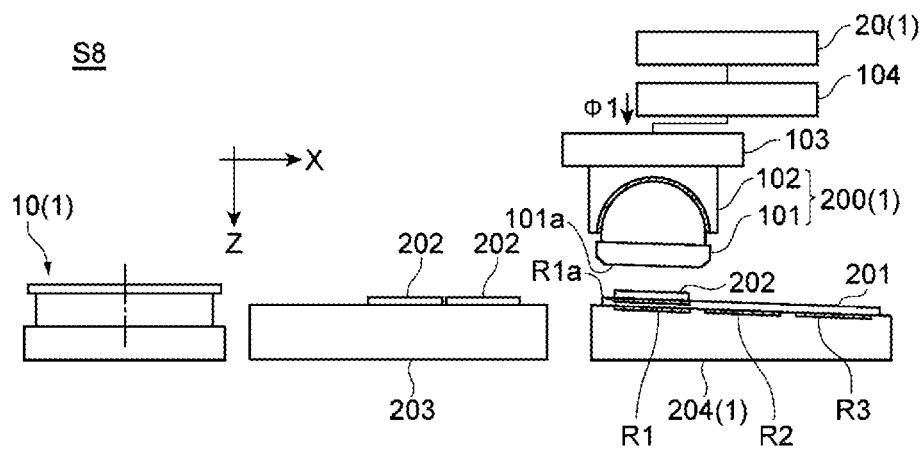

Next, the inclination of the chip holding part 101 is adjusted (S4 (second step): FIGS. 5 and 6).

The adjustment controller 20 reads the inclination information corresponding to the position where the chip part 202 is to be disposed. Then, the position (deviation D) of the stage reference axis A2 with respect to the jig reference axis A1 and the pressing force F are calculated using the read inclination information and the characteristic information of the elastic deformation part 14. Based on the calculated deviation D and pressing force F, the adjustment controller 20 outputs a control signal indicating the target position of the chip holding part 101 to the main controller 104. Upon receiving the control signal, the main controller 104 outputs a control signal φ1 to the actuator so that the X-direction position and the Y-direction position become the target positions (S4a: see (a) of FIG. 5).

In this state, the movable part 102a of the inclination adjustment mechanism 102 is locked. That is, the movable part 102a cannot be inclined. The main controller 104 gives the control signal φ1 to unlock the inclination adjustment mechanism 102 (S4b: see (b) of FIG. 5).

The adjustment controller 20 outputs a control signal φ2 to the main controller 104 so that the Z-direction position of the chip holding part 101 becomes the target position. The chip holding surface 101a of the chip holding part 101 is pressed against the conforming surface 13a. Since the elastic deformation part 14 causes uneven deformation, the plate member 13 is inclined. The movable part 102a of the inclination adjustment mechanism 102 that holds the chip holding part 101 is inclined conforming to the inclination of the plate member 13 (S4c: see (a) of FIG. 6). The plate member 13 of the conforming jig 10 is inclined due to the pressing force F. The inclination of the conforming jig 10 is not caused without pressing of the chip holding part 101. The inclination of the conforming jig 10 caused by pressing of the chip holding part 101 is referred to as passive inclination of the conforming jig 10.

When the conforming jig 10 is inclined, the main controller 104 gives the control signal 91. In this way, the movable part 102a of the inclination adjustment mechanism 102 is locked (S4d: see (b) of FIG. 6). Therefore, the inclination of the chip holding part 101 is maintained.

Next, the chip part 202 is held (S5: (a) of FIG. 7). The main controller 104 gives the control signal φ1 to the actuator 103. As a result, the bonding head 200 moves above the chip part 202. Next, the main controller 104 moves the bonding head 200 downward along the Z direction. Next, the main controller 104 causes the bonding head 200 to hold the chip part 202. Then, the main controller 104 moves the bonding head 200 holding the chip part 202 upward along the Z direction.

Next, the chip part 202 is moved to the substrate 201 (S6: (b) of FIG. 7). The main controller 104 gives the control signal φ1 to the actuator 103. As a result, the bonding head 200 moves above the region R1a of the substrate 201 where the chip part 202 is to be disposed.

Next, the chip part 202 is mounted on the substrate 201 (S7: (a) of FIG. 8). The main controller 104 gives the control signal φ1 to the actuator 103. As a result, the bonding head 200 moves downward in the Z direction toward the substrate 201. At this time, the chip holding surface 101a of the chip holding part 101 is parallel to the mounting surface 201a of the substrate 201. Assuming that the surface of the chip part 202 held by the chip holding part 101 and the opposite surface facing the substrate 201 are parallel to each other, the chip bonding surface 202a of the chip part 202 held by the chip holding surface 101a is also parallel to the mounting surface 201a of the substrate 201. The bonding head 200 performs desired processing required for bonding, such as heating for thermal curing of the adhesive.

Next, the bonding head 200 is separated from the chip part 202 (S8: (b) of FIG. 8). The main controller 104 gives the control signal φ1 to the bonding head 200. As a result, the suction operation of the bonding head 200 stops. The main controller 104 gives the control signal φ1 to the actuator 103. As a result, the bonding head 200 moves upward in the Z direction from the substrate 201. The chip part 202 is mounted on the substrate 201 by the above steps.

<Action and Effects>

In the bonding apparatus 1 and the bonding head adjustment method, even when the substrate 201 is placed on the substrate stage 204, the adjustment controller 20 has the inclination information of the stage main surface 204a. As a result, the inclination of the chip holding part 101 may be adjusted according to the inclination of the place where the chip part 202 is to be disposed. Therefore, the yield of die bonding operation may be improved.

The bonding apparatus of the present invention is not limited to the above embodiments.

First Modified Example

Figure 9:
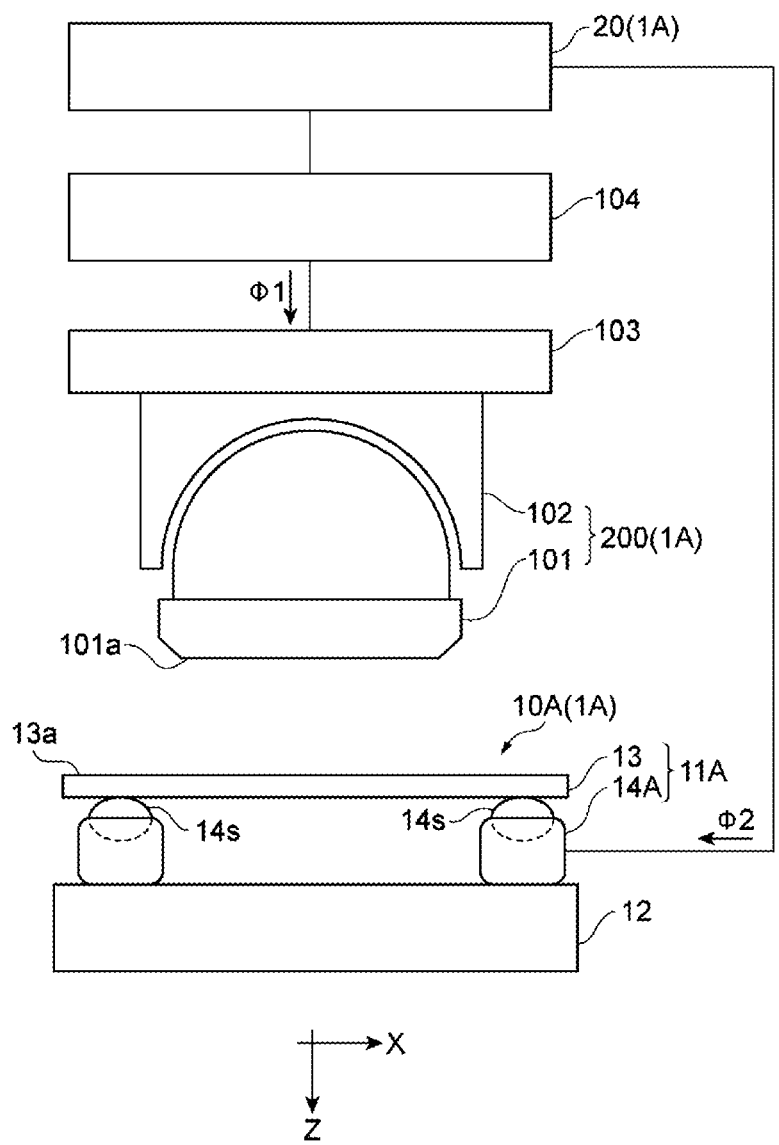
FIG. 9 is a diagram showing a configuration of a bonding apparatus according to a first modified example.

As described above, the elastic deformation part is not limited to having a constant rigidity. The rigidity of the elastic deformation part may be variable as shown in the graph G3 of (c) of FIG. 3. FIG. 9 shows an example of a bonding apparatus 1A capable of controlling the rigidity of the elastic deformation part 14A to any rigidity. The bonding apparatus 1A includes a conforming jig 10A. The conforming jig 10A includes a passive inclination part 11A. The elastic deformation part 14A of the passive inclination part 11A of the conforming jig 10A includes a variable rigidity part 14s whose rigidity (elastic coefficient or Young's modulus) may be controlled. The variable rigidity part 14s may be controlled based on the control signal φ2 output from the adjustment controller 20 for adjusting the rigidity by, for example, hydraulic pressure, water pressure, or air pressure.

Second Modified Example

Figure 10:
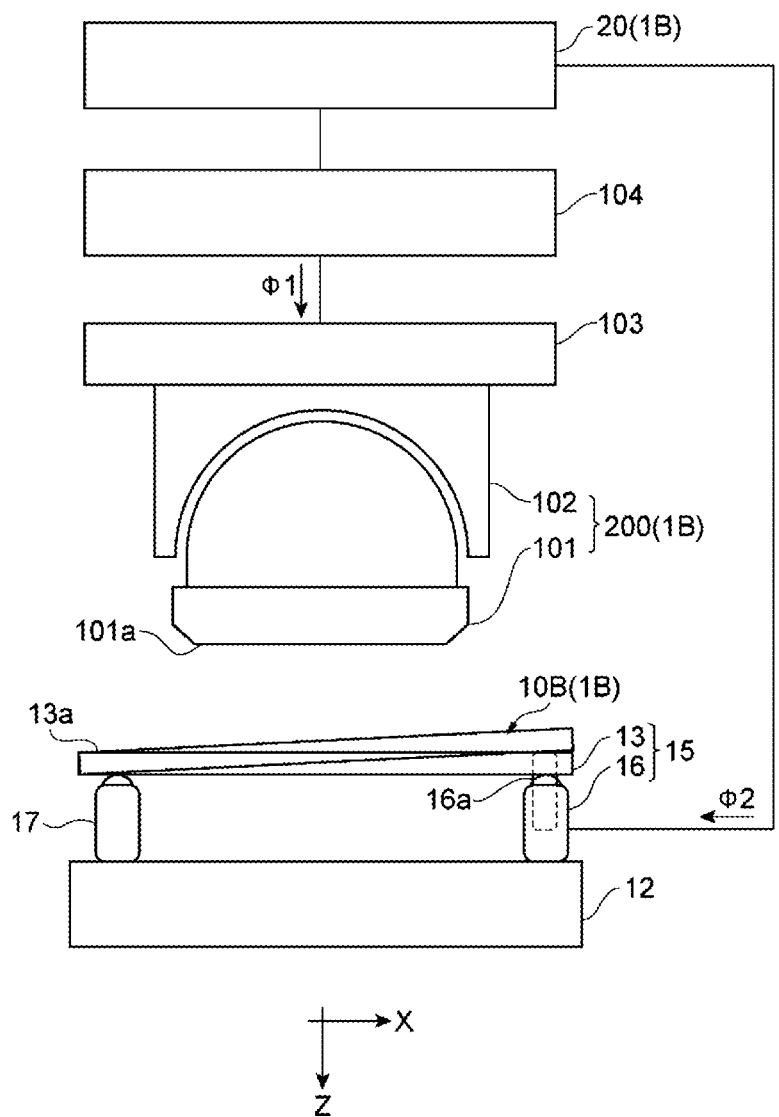
FIG. 10 is a diagram showing a configuration of a bonding apparatus according to a second modified example.

In the conforming jig 10 of the embodiment, the inclination of the plate member 13 is passively caused due to the pressing force. For example, as shown in FIG. 10, the inclination of the conforming jig 10B of the bonding apparatus 1B may be actively caused. This active means that the inclination occurs even if the chip holding part 101 is not pressed. The bonding apparatus 1B of the second modified example includes an active inclination part 15 in place of the passive inclination part 11. The active inclination part 15 includes a plate member 13 and a drive column 16 (plate member drive part). The drive column 16 is disposed at a corner of the plate member 13, for example. A tip of a drive end 16a abuts on the plate member 13. The supports for the plate member 13 need not all be drive columns 16. The drive columns 16 are provided at three corners of the rectangular plate member 13. A support column 17 may be disposed at one corner. The support column 17 does not have a variable protrusion length like the drive column 16. The drive column 16 receives the control signal φ2 from the adjustment controller 20. As a result, the protrusion length of the drive column 16 is adjusted. By adjusting the protrusion length of the drive column 16, it is possible to set the inclination of the plate member 13 to a desired inclination.

Figure 11:
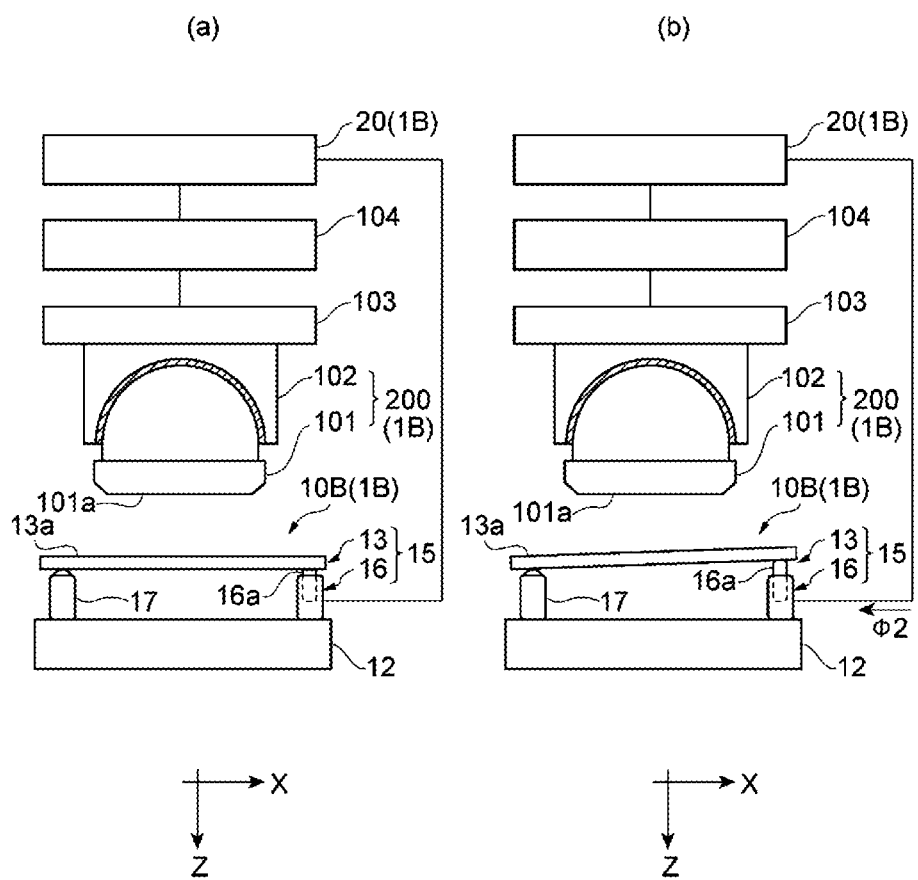
In FIG. 11, (a) of FIG. 11 is a diagram showing a step in the bonding head adjustment operation; (b) of FIG. 11 is a diagram showing a step following (a) of FIG. 11 in the bonding head adjustment operation.
Figure 12:
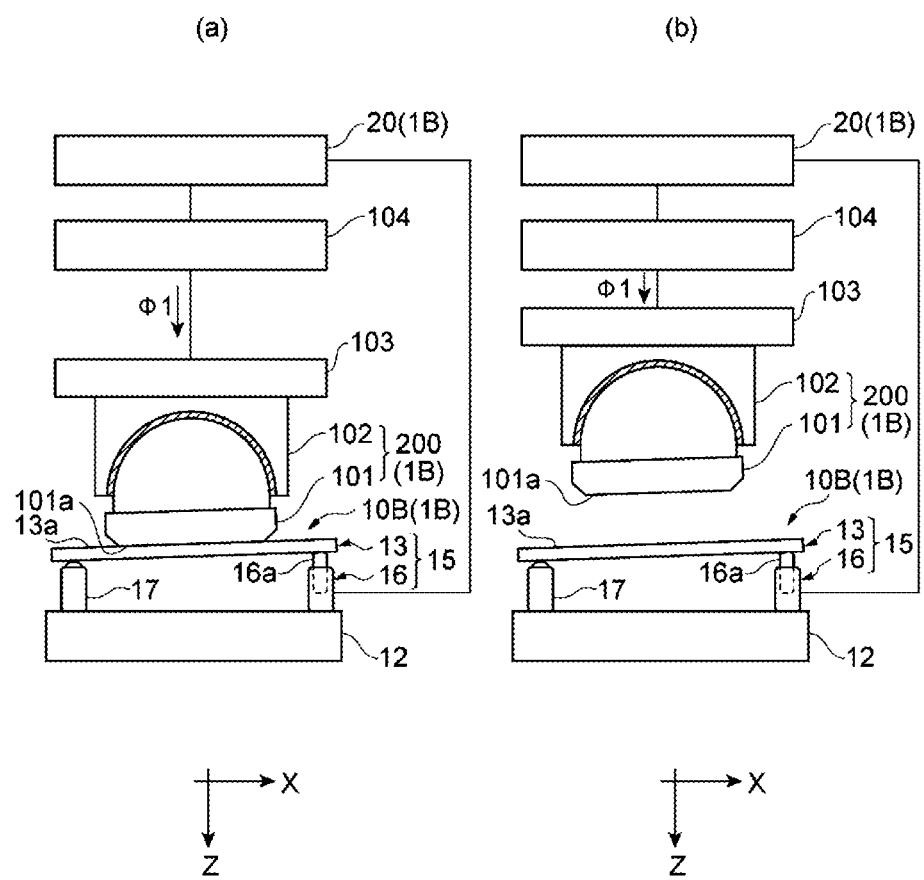
In FIG. 12, (a) of FIG. 12 is a diagram showing a step following (b) of FIG. 11 in the bonding head adjustment operation; (b) of FIG. 12 is a diagram showing a step following (a) of FIG. 12 in the bonding head adjustment operation.

According to the bonding apparatus 1B, the inclination of the chip holding part 101 may be adjusted by the steps shown in FIGS. 11 and 12. As shown in (a) of FIG. 11, the chip holding part 101 is moved above the conforming jig 10B. The chip holding part 101 may be positioned above the plate member 13. Strict alignment as shown by the deviation D between the jig reference axis A1 and the stage reference axis A2 is not required as in the embodiment. Next, as shown in (b) of FIG. 11, the adjustment controller 20 outputs the control signal φ2 to the drive column 16. The drive column 16 adjusts the length of the drive end 16a based on the control signal φ2. By adjusting the length of the drive end 16a, the plate member 13 is set to a desired inclination. Further, the main controller 104 unlocks the inclination adjustment mechanism 102. Subsequently, as shown in (a) of FIG. 12, the main controller 104 outputs the control signal φ1. The actuator 103 moves the inclination adjustment mechanism 102 and the chip holding part 101 downward in the Z direction. At this time, the lock of the movable part 102a of the inclination adjustment mechanism 102 is released. Therefore, the chip holding part 101 fixed to the movable part 102a conforms to the inclination of the plate member 13. At this time, it is sufficient that the chip holding surface 101a is in contact with the conforming surface 13a. That is, no pressing force is generated. After that, the main controller 104 locks the movable part 102a. Then, as shown in (b) of FIG. 12, the main controller 104 outputs the control signal @1. The actuator 103 moves the inclination adjustment mechanism 102 and the chip holding part 101 upward in the Z direction. Adjustment of the inclination of the chip holding part 101 is completed by the above steps.

What is claimed is:

1. A bonding apparatus comprising:
 a stage comprising a placement surface on which a substrate is to be placed;
 a bonding head for disposing a chip part on the substrate placed on the stage and comprising a chip holding surface for holding the chip part by suction and an adjustment part for adjusting an inclination of the chip holding surface;
 an information holding part for holding inclination information of the stage that associates a position on the placement surface with an inclination at the position; and
 a conforming jig comprising a conforming surface onto which the chip holding surface is pressed, wherein an inclination of the conforming surface is changeable such that the inclination of the chip holding surface corresponds to an inclination indicated by the inclination information, and
 the conforming jig is disposed separately in an X-axis direction and is detached from the stage,
 wherein the X-axis direction is orthogonal to a Z-axis direction, and the Z-axis direction is a direction that the bonding head moves toward or away from the placement surface of the stage.

2. The bonding apparatus according to claim 1, wherein the conforming jig comprises a passive inclination part which comprises the conforming surface and in which the conforming surface is passively inclined by a force received by the conforming surface, and
 wherein the bonding apparatus further comprises:
 a control part that acquires the inclination information from the information holding part and controls a force that the chip holding surface applies to the conforming surface based on the inclination at the position when the chip holding surface is pressed against the conforming surface.

3. The bonding apparatus according to claim 2, wherein the passive inclination part comprises:
 a plate member comprising the conforming surface; and
 an elastic deformation part provided on a surface of the plate member opposite to the conforming surface, and
 the elastic deformation part is made of a resin material.

4. The bonding apparatus according to claim 2, wherein the passive inclination part comprises:
 a plate member comprising the conforming surface; and
 an elastic deformation part provided on a surface of the plate member opposite to the conforming surface, and the elastic deformation part is a metal spring.

5. The bonding apparatus according to claim 1, wherein the conforming jig comprises an active inclination part which comprises the conforming surface and in which the conforming surface is actively inclined regardless of a force received by the conforming surface, the active inclination part comprises:

a plate member comprising the conforming surface; and a plate member drive part provided on a surface of the plate member opposite to the conforming surface and actively controlling an inclination of the plate member, and the plate member drive part inclines the plate member such that the inclination of the conforming surface corresponds to an inclination indicated by the inclination information provided from the information holding part.

6. A bonding head adjustment method for adjusting an inclination of a chip holding surface of a bonding head for disposing a chip part with respect to a substrate placed on a placement surface of a stage having the placement surface on which the substrate is to be placed, wherein the chip holding surface holds the chip part by suction, the bonding head adjustment method comprising:

a first step of acquiring inclination information that associates a position on the placement surface with an inclination at the position; and a second step of adjusting the inclination of the chip holding surface based on the inclination information associated with the position on the placement surface corresponding to a position of the substrate on which the chip part is to be disposed, wherein the second step adjusts the inclination of the chip holding surface using a conforming jig in which a conforming surface is passively inclined in response to pressing of the chip holding surface, and the conforming jig is disposed separately in an X-axis direction and is detached from the stage, wherein the X-axis direction is orthogonal to a Z-axis direction, and the Z-axis direction is a direction that the bonding head moves toward or away from the placement surface of the stage.

7. A bonding head adjustment method for adjusting an inclination of a chip holding surface of a bonding head for disposing a chip part with respect to a substrate placed on a placement surface of a stage having the placement surface on which the substrate is to be placed, wherein the chip holding surface holds the chip part by suction, the bonding head adjustment method comprising:

a first step of acquiring inclination information that associates a position on the placement surface with an inclination at the position; and a second step of adjusting the inclination of the chip holding surface based on the inclination information associated with the position on the placement surface corresponding to a position of the substrate on which the chip part is to be disposed, wherein the second step adjusts the inclination of the chip holding surface using a conforming jig in which a conforming surface is actively inclined regardless of pressing of the chip holding surface, and the conforming jig is disposed separately in an X-axis direction and is detached from the stage, wherein the X-axis direction is orthogonal to a Z-axis direction, and the Z-axis direction is a direction that the bonding head moves toward or away from the placement surface of the stage.

* * * * *